United States Patent [19]
Murray et al.

[11] Patent Number: 5,394,143
[45] Date of Patent: Feb. 28, 1995

[54] RUN-LENGTH COMPRESSION OF INDEX KEYS

[75] Inventors: James C. Murray, Nashua; Gennady Antoshenkov, Amherst, both of N.H.

[73] Assignee: Digital Equipment Corporation, Maynard, Mass.

[21] Appl. No.: 85,535

[22] Filed: Jun. 30, 1993

[51] Int. Cl.[6] .......................................... H03M 7/46
[52] U.S. Cl. ............................ 341/63; 341/50; 364/DIG. 2; 364/962.3; 364/962.2; 395/425
[58] Field of Search ............. 341/50, 63; 364/DIG.2, 364/962-963.5; 395/425

[56] References Cited

U.S. PATENT DOCUMENTS

| | | | |
|---|---|---|---|
| 4,677,550 | 6/1987 | Ferguson | 364/300 |
| 4,843,389 | 6/1989 | Lisle et al. | 341/106 |
| 4,945,475 | 7/1990 | Bruffey et al. | 364/200 |
| 5,001,477 | 3/1991 | Hicks et al. | 341/50 |
| 5,270,712 | 12/1993 | Iyer et al. | 341/50 |

OTHER PUBLICATIONS

Hicks, Compressing Sort Keys While Maintaining Sort Sequence, IBM Technical Disclosure Bulletin vol. 26 No. 1, Jun. 1983, pp. 388-391.
Rudolf Bayer & Karl Unterauer "Prefix B-Trees," ACM Transactions on Database Systems, vol. 2, No. 1, Mar. 1977.
M. Blasgen, R. Casey, & K. Eswaran "An Encoding Method for Multi-Field Sorting and Indexing," IBM Research Laboratory, San Jose, California, RJ 1753 (25561), Mar. 30, 1976.
Donald E. Knuth "Hu-Tucker" encoding in, Art of Computer Programming, vol. 3, p. 444 in Addison-Wesley 1973 edition.
Gilbert Held "Data Compression," Chapts. 2, 3, 3rd Edition.

*Primary Examiner*—Howard L. Williams
*Attorney, Agent, or Firm*—Barry N. Young

[57] ABSTRACT

The invention is a compression method which provides the advantages of run-length compression while preserving the natural collating order of the data. The method of the invention replaces sequential repetitions of a target pattern beyond a threshold value followed by a single number which encodes both the repetition count and the collating relationship between the target pattern and the pattern which follows it in the uncollated sequence. In the preferred embodiment of the invention, the code is preceded by at least one repetition of the pattern. In the preferred embodiment of the invention, the numerical code is set as the difference between the run count and the threshold count if the following pattern is less than the target pattern, or if there is no following pattern. If the following pattern is greater than the compression sequence, the code is set as a predetermined number, preferably the maximum binary value of the sequence length, minus the difference between the run count and the threshold count.

5 Claims, 5 Drawing Sheets

ENCODING PROCEDURE

CV1 CV2 CV2 ... CV2 CV3 CV2 CV2 ... CV2
⎵_____⎵  ⎵_____⎵
        R1                    R2

CV1 CV2 CC1 CV3 CV2 CC2

WHERE

CC1 = R2 - T    IF CV3 < CV2

255 - (R2 - T)   IF CV3 > CV2

CC2 = R2 - T

ENCODING PROCEDURE

DEC Multinational Character Set (C0 and GL Codes)

| COLUMN | | | 0 | | 1 | | 2 | | 3 | | 4 | | 5 | | 6 | | 7 | |
|---|---|---|---|---|---|---|---|---|---|---|---|---|---|---|---|---|---|---|
| | b8 BITS | | 0 | | 0 | | 0 | | 0 | | 0 | | 0 | | 0 | | 0 | |
| | b7 | | 0 | | 0 | | 0 | | 0 | | 1 | | 1 | | 1 | | 1 | |
| | b6 | | 0 | | 0 | | 1 | | 1 | | 0 | | 0 | | 1 | | 1 | |
| ROW | b5 b4 b3 b2 b1 | | 0 | | 1 | | 0 | | 1 | | 0 | | 1 | | 0 | | 1 | |
| 0 | 0 0 0 0 | NUL | 0 0 0 | DLE | 20 16 10 | SP | 40 32 20 | 0 | 60 48 30 | @ | 100 64 40 | P | 120 80 50 | ` | 140 96 60 | p | 160 112 70 |
| 1 | 0 0 0 1 | SOH | 1 1 1 | DC1 (XON) | 21 17 11 | ! | 41 33 21 | 1 | 61 49 31 | A | 101 65 41 | Q | 121 81 51 | a | 141 97 61 | q | 161 113 71 |
| 2 | 0 0 1 0 | STX | 2 2 2 | DC2 | 22 18 12 | " | 42 34 22 | 2 | 62 50 32 | B | 102 66 42 | R | 122 82 52 | b | 142 98 62 | r | 162 114 72 |
| 3 | 0 0 1 1 | ETX | 3 3 3 | DC3 (XOFF) | 23 19 13 | # | 43 35 23 | 3 | 63 51 33 | C | 103 67 43 | S | 123 83 53 | c | 143 99 63 | s | 163 115 73 |
| 4 | 0 1 0 0 | EOT | 4 4 4 | DC4 | 24 20 14 | $ | 44 36 24 | 4 | 64 52 34 | D | 104 68 44 | T | 124 84 54 | d | 144 100 64 | t | 164 116 74 |
| 5 | 0 1 0 1 | ENQ | 5 5 5 | NAK | 25 21 15 | % | 45 37 25 | 5 | 65 53 35 | E | 105 69 45 | U | 125 85 55 | e | 145 101 65 | u | 165 117 75 |
| 6 | 0 1 1 0 | ACK | 6 6 6 | SYN | 26 22 16 | & | 46 38 26 | 6 | 66 54 36 | F | 106 70 46 | V | 126 86 56 | f | 146 102 66 | v | 166 118 76 |
| 7 | 0 1 1 1 | BEL | 7 7 7 | ETB | 27 23 17 | ' | 47 39 27 | 7 | 67 55 37 | G | 107 71 47 | W | 127 87 57 | g | 147 103 67 | w | 167 119 77 |
| 8 | 1 0 0 0 | BS | 10 8 8 | CAN | 30 24 18 | ( | 50 40 28 | 8 | 70 56 38 | H | 110 72 48 | X | 130 88 58 | h | 150 104 68 | x | 170 120 78 |
| 9 | 1 0 0 1 | HT | 11 9 9 | EM | 31 25 19 | ) | 51 41 29 | 9 | 71 57 39 | I | 111 73 49 | Y | 131 89 59 | i | 151 105 69 | y | 171 121 79 |
| 10 | 1 0 1 0 | LF | 12 10 A | SUB | 32 26 1A | * | 52 42 2A | : | 72 58 3A | J | 112 74 4A | Z | 132 90 5A | j | 152 106 6A | z | 172 122 7A |
| 11 | 1 0 1 1 | VT | 13 11 B | ESC | 33 27 1B | + | 53 43 2B | ; | 73 59 3B | K | 113 75 4B | [ | 133 91 5B | k | 153 107 6B | { | 173 123 7B |
| 12 | 1 1 0 0 | FF | 14 12 C | FS | 34 28 1C | , | 54 44 2C | < | 74 60 3C | L | 114 76 4C | \ | 134 92 5C | l | 154 108 6C | \| | 174 124 7C |
| 13 | 1 1 0 1 | CR | 15 13 D | GS | 35 29 1D | - | 55 45 2D | = | 75 61 3D | M | 115 77 4D | ] | 135 93 5D | m | 155 109 6D | } | 175 125 7D |
| 14 | 1 1 1 0 | SO | 16 14 E | RS | 36 30 1E | . | 56 46 2E | > | 76 62 3E | N | 116 78 4E | ^ | 136 94 5E | n | 156 110 6E | ~ | 176 126 7E |
| 15 | 1 1 1 1 | SI | 17 15 F | US | 37 31 1F | / | 57 47 2F | ? | 77 63 3F | O | 117 79 4F | _ | 137 95 5F | o | 157 111 6F | DEL | 177 127 7F |

|←— C0 CODES —→|←————— GL CODES (ASCII GRAPHICS) —————→|

KEY

| CHARACTER | | |
|---|---|---|
| ESC | 33 | OCTAL |
| | 27 | DECIMAL |
| | 1B | HEX |

FIGURE 3A

DEC Multinational Character Set (C1 and GR Codes)

| 8 | 9 | 10 | 11 | 12 | 13 | 14 | 15 | COLUMN b8 BITS b7 b6 b5 b4 b3 b2 b1 | ROW |
|---|---|---|---|---|---|---|---|---|---|
| | | | | | | | | 0 0 0 0 | |
| | | | | | | | | 0 0 0 1 | |
| | | | | | | | | 0 0 1 0 | |
| | | | | | | | | 0 0 1 1 | |
| 200 128 80 | 220 DCS 144 90 | 240 /// 160 A0 | 260 ° 176 B0 | 300 À 192 C0 | 320 Ð 208 D0 | 340 à 224 E0 | 360 240 F0 | 0 0 0 0 | 0 |
| 201 129 81 | 221 PU1 145 91 | 241 ¡ 161 A1 | 261 ± 177 B1 | 301 Á 193 C1 | 321 Ñ 209 D1 | 341 á 225 E1 | 361 ñ 241 F1 | 0 0 0 1 | 1 |
| 202 130 82 | 222 PU2 146 92 | 242 ¢ 162 A2 | 262 ² 178 B2 | 302 Â 194 C2 | 322 Ò 210 D2 | 342 â 226 E2 | 362 ò 242 F2 | 0 0 1 0 | 2 |
| 203 131 83 | 223 STS 147 93 | 243 £ 163 A3 | 263 ³ 179 B3 | 303 Ã 195 C3 | 323 Ó 211 D3 | 343 ã 227 E3 | 363 ó 243 F3 | 0 0 1 1 | 3 |
| IND 204 132 84 | 224 CCH 148 94 | 244 164 A4 | 264 180 B4 | 304 Ä 196 C4 | 324 Ô 212 D4 | 344 ä 228 E4 | 364 ô 244 F4 | 0 1 0 0 | 4 |
| NEL 205 133 85 | 225 MW 149 95 | 245 ¥ 165 A5 | 265 µ 181 B5 | 305 Å 197 C5 | 325 Õ 213 D5 | 345 å 229 E5 | 365 õ 245 F5 | 0 1 0 1 | 5 |
| SSA 206 134 86 | 226 SPA 150 96 | 246 166 A6 | 266 ¶ 182 B6 | 306 Æ 198 C6 | 326 Ö 214 D6 | 346 æ 230 E6 | 366 ö 246 F6 | 0 1 1 0 | 6 |
| ESA 207 135 87 | 227 EPA 151 97 | 247 § 167 A7 | 267 · 183 B7 | 307 Ç 199 C7 | 327 Œ 215 D7 | 347 ç 231 E7 | 367 œ 247 F7 | 0 1 1 1 | 7 |
| HTS 210 136 88 | 230 152 98 | 250 ¤ 168 A8 | 270 184 B8 | 310 È 200 C8 | 330 Ø 216 D8 | 350 è 232 E8 | 370 ø 248 F8 | 1 0 0 0 | 8 |
| HTJ 211 137 89 | 231 153 99 | 251 © 169 A9 | 271 ¹ 185 B9 | 311 É 201 C9 | 331 Ù 217 D9 | 351 é 233 E9 | 371 ù 249 F9 | 1 0 0 1 | 9 |
| VTS 212 137 8A | 232 154 9A | 252 ª 170 AA | 272 º 186 BA | 312 Ê 202 CA | 332 Ú 218 DA | 352 ê 233 EA | 372 ú 250 FA | 1 0 1 0 | 10 |
| PLD 213 139 8B | 233 CSI 155 9B | 253 « 171 AB | 273 » 187 BB | 313 Ë 203 CB | 333 Û 219 DB | 353 ë 234 EB | 373 û 251 FB | 1 0 1 1 | 11 |
| PLU 214 140 8C | 234 ST 156 9C | 254 172 AC | 274 ¼ 188 BC | 314 Ì 204 CC | 334 Ü 220 DC | 354 ì 235 EC | 374 ü 252 FC | 1 1 0 0 | 12 |
| RI 215 141 8D | 235 OSC 157 9D | 255 173 AD | 275 ½ 189 BD | 315 Í 205 CD | 335 Ÿ 221 DD | 355 í 236 ED | 375 ÿ 253 FD | 1 1 0 1 | 13 |
| SS2 216 142 8E | 236 PM 158 9E | 256 174 AE | 276 190 BE | 316 Î 206 CE | 336 222 DE | 356 î 237 EE | 376 254 FE | 1 1 1 0 | 14 |
| SS3 217 143 8F | 237 APC 159 9F | 257 175 AF | 277 ¿ 191 BF | 317 Ï 207 CF | 337 ß 223 DF | 357 238 EF | 377 /// 255 FF | 1 1 1 1 | 15 |

|← C1 CODES →|← GR CODES (DEC SUPPLEMENTAL GRAPHICS) →|

FIGURE 3B

RUN-LENGTH COMPRESSION OF INDEX KEYS

FIELD OF THE INVENTION

This invention relates to an improved method for storing and retrieving data using a computer, and more specifically to an improved method for run-length data compression which preserves the natural collating order of the data which is compressed.

BACKGROUND OF THE INVENTION

Techniques for efficiently storing and searching large databases are increasingly important in a variety of communications and electronic data storage applications. Extremely large databases are logically structured to minimize the search times expected for typical searches of the database. For example, data will be stored in records in one portion of the data base, but, to save the necessity of searching each record in order to find one in particular, a key may be provided which points to the physical location of each record, or to the location of a particular type of data within that record. These keys are arranged in ordered indices using configurations, such as B-trees, which may be efficiently searched. When a particular piece of data in a particular record is sought, the key index is searched to identify the desired record, and then the record is searched to find the desired piece of data. Because this form of search is so much more efficient than a linear search through the entire database, large databases normally include a number of ordered indices designed to facilitate searching in all of the commonly expected modes.

In addition, physical data compression techniques are often employed to reduce hardware costs, storage space requirements, and data transfer times. They are particularly attractive for suppressing runs of repeating characters or patterns, such as the trailing blanks or spaceholder characters at the end of a fixed-length data field. Since each data item must be first compressed, and later decompressed, a compression algorithm which is cumbersome to implement will offset many of the efficiencies provided by the reduction in size of the data base, and, in the worst cases, may actually reduce system performance. Run-length compression is a popular compression technique because it provides significant data compaction for repeating characters or patterns using very simple compression and decompression algorithms. In conventional run-length compression, sequential repetitions of a target pattern beyond a predetermined threshold are replaced by a special character which signals that compression follows, the compressed pattern, and a count of the number of repetitions. Frequent choices for compression are "spacer" characters, such as asterisks, underscores, dashes and space characters. Thus, a run-length compression of the spaces (represented as x's for easier visualization) in the data sequences:

BENxxxxxxxTHOMASxxxx
BEN-SUNGxxMARYxxxxxx
BENTLEYxxxJOHNxxxxMD
BENTLEYxxxJOHNxxxPHD would yield (using \ as the special compression character) the much shorter:

BEN \×7THOMAS \×4
BEN-SUNG\ ×2MARY \ ×6
BENTLEY \×3JOHN \ ×4MD
BENTLEY \ ×3JOHN \ ×3PHD

However, conventional run length compression cannot be used with ordered data indices or other ordered data because it does not preserve the natural collating sequence of the data. This issue arises because the characters are represented, and manipulated, in the computer as binary codes, each of which corresponds to a numerical value. Different computers use different character set representations. For example, FIG. 3 shows the 8 bit ASCII character set representation, a standard representation commonly used in the industry. The bit representation is shown on the horizontal and vertical axes, with bits 1-4 on the vertical axis and bits 5-7 on the horizontal axis. The character represented by each combination of bits is shown in the grid, while the three small numbers next to each character in the grid, are the bit values in octal, decimal, and hexadecimal respectively. For example, the character A is represented by the bit sequence 1000001, which is <101> in octal, <65> in decimal and <41> in hexadecimal. For convenience, decimal values are used in this description, but this limitation is not required to implement the invention. Sequences of data may be collated in their "natural" sequence, which would be the numerical order of their bit values, or in a specially programmed collating sequence which maps the bit values to a different order. An example of a specially programmed sequence would be one in which the values <65>,<66>,<97>,<98> were always collated in the order ,<65>,<97>,<66>,<98> so that the intuitive (to people) ordering A,a,B,b was adhered to by the machine. Specially programmed collating sequences require added time and space in comparison with natural collating sequences, and also require that the natural collating order of the character set be known in advance to the programmer. However, the characters used as spacers and special compression characters tend not to collate naturally when concatenated with the alphanumeric characters, and tend not to be assigned the same relative character values in different character sets.

In the example shown above, the natural collating sequence of the compressed data would depend on what value the character \ was assigned relative to the alphanumeric characters. In the ASCII character set shown in FIG. 3, the capital letters have the character values <65> to <90>, the numerals have the values <48> to <57>, —(dash) has the value <45>, space has the value <32>, and \ has the value <92>. If the natural collating sequence of this character set were adhered to, the compressed sequence would collate as:

BEN-SUNG \ ×2MARY \ ×6
BENTLEY \ ×3JOHN \ ×3PHD
BENTLEY\ 3JOHN \ ×4MD
BEN \ ×7THOMAS \ ×4

Because the special compression character has a higher value than the letters or the dash, and because the compression count is collated as if it were a character in the sequence, the natural collating order would not be preserved.

If the special compression character were omitted because only one character was being compressed, a common situation in databases where there is a single spacer character which repeats much more frequently than any other character, the sequence would compress as:

BEN×7THOMAS×4
BEN-SUNG×2MARY×6
BENTLEY×3JOHN×4MD
BENTLEY×3JOHN×3PHD and, again using ASCII as an example, would collate as:

BEN×7THOMAS×4
BEN-SUNG×2MARY×6
BENTLEY×3JOHN×3PHD
BENTLEY×3JOHN×4MD

Again, the natural collating order is lost due to the compression. In this instance, it is the run count, rather than the special character, which interferes with the natural collating sequence. Collating errors caused by the run count are very difficult to correct for by programming a special collating sequence, since the count can vary over a broad range of values.

The collating sequence limitation significantly restricts the possible areas of application for run length compression and forces data base and telecommunications system designers to rely on significantly less efficient compression techniques for data base key indices and other ordered or sortable data base structures.

SUMMARY OF THE INVENTION

The invention is a compression method which provides the advantages of run-length compression while preserving the natural collating order of the data. The method of the invention replaces sequential repetitions of a target pattern beyond a threshold value with a single repetition of the pattern followed by a single number which encodes both the repetition count and the collating relationship between the target pattern and the pattern which follows it in the uncollated sequence.

In a computer system comprising a data processing means, a memory means, and a data storage device containing data records, the invention is preferably implemented by selecting a target pattern for compression and a threshold count beyond which repetitions of the target pattern are to be compressed, reading a stream of data characters in sequence, comparing the characters with the target pattern and recording a run count of sequential repetitions of the target pattern, determining whether the run count exceeds the threshold count, and whenever it does, first determining whether the data pattern immediately following the run of target patterns in the data stream is greater than or less than the target pattern, and then replacing all repetitions of the target pattern in excess of the run count with a character string which includes a numerical code chosen to be the difference between the and the threshold count if the following pattern is less than the target pattern or if there is no following pattern, and to be a preselected number less the difference between the run count and the threshold count if the following pattern is greater than the target pattern. In the most preferred embodiment of the invention, the preselected number used is the maximum binary value of the sequence length.

BRIEF DESCRIPTION OF THE DRAWINGS

FIG. 3 is a chart of an 8 bit ASCII character set.

DETAILED DESCRIPTION OF THE EMBODIMENTS

The present invention is intended to operate in a computer or telecommunications system comprising a data processing means, a memory means, and a data storage device containing data records. The data processing means may be, for example, a conventional computer or a microprocessor in a modem or other communications device. The data storage device may be, for example, a conventional disk drive or a buffer embedded in a modem.

The invention describes a method of operating the data processing means for compactly storing data while maintaining its natural collating sequence, and for efficiently restoring retrieved data to an uncompacted form using a general compression technique. In the following description, numerous specific details and examples are set forth in order to provide a thorough understanding of the present invention. It will be obvious, however, to one skilled in the art that variants are possible and that the invention may be practiced without adhering to these details in every particular. In some instances where well-known methods are employed, their details are omitted in order not to unnecessarily obscure the present invention.

Figures 1A, 1B:
FIG. 1A is a general representation of the structure of an uncompressed data string suitable for compression in accordance with the invention.
FIG 1B is a general representation of the structure of the data string of FIG. 1A when compressed in accordance with the invention.

Referring to FIG. 1A, there is shown generally the structure of an uncompressed data string containing repetitions of a target pattern and therefore suitable for compression in accordance with the present invention. In order to fully understand the present method, it should be understood that each symbol CV1, CV2, and CV3 represents the binary value of a character in a sequential data stream, S. The binary values chosen generally conform to one of a number of commonly used character sets, such as the ASCII character set shown in FIG. 3. Although ASCII has been used as an exemplary character set, the present invention is not limited to ASCII representation, and may be used with any character set. CV2 is serially repeated in the data stream a total of R1 times at its first occurrence, and R2 times at its second occurrence.

Figure 2:
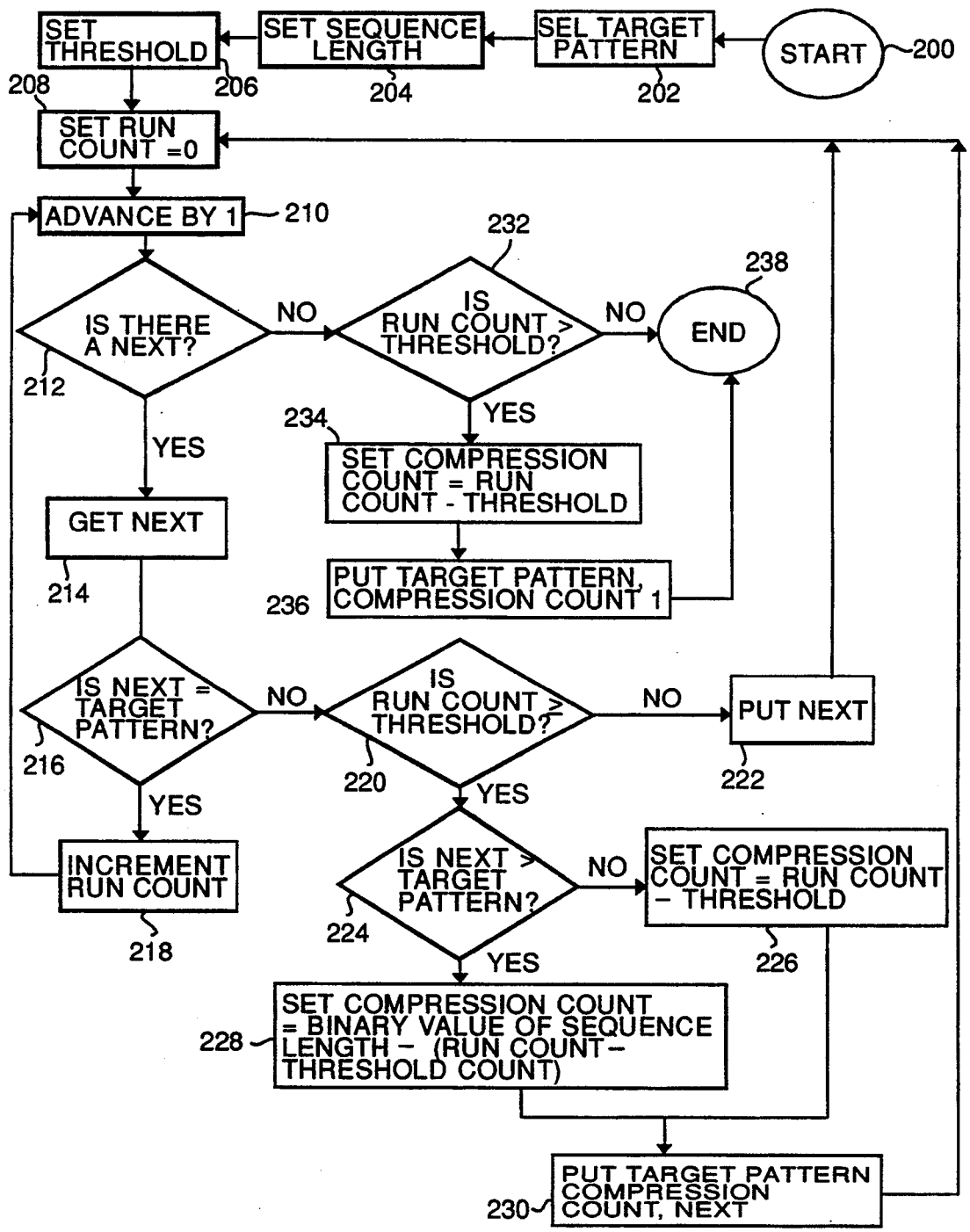
FIG. 2 is a flow chart of a compression procedure in accordance with a preferred embodiment of the current invention.

FIG. 2 is a flow chart of a compression procedure in accordance with a preferred embodiment of the current invention. In step 200 the procedure is started, and in step 202 the sequence which will be the target for compression is selected. The target may be either a single-octet character, such as the ASCII representation of the space character, a multi-octet character, such as may be found in representations of Japanese or Chinese characters, or even a run of repeating characters.

In step 204, a sequence length equal to the length of the target pattern is selected. Thus, if the target pattern is one single-octet character, the sequence length will be one, but if the target pattern is a character or sequence which fills four octets, the sequence length will be four octets also. In the present invention, the sequence length also determines the compression ceiling, the maximum run of target patterns which can be compressed at once. The compression ceiling for the preferred embodiment of the present invention is half of the maximum binary value which can be stored in the sequence length, plus one. Thus, for a one octet target pattern, the maximum binary value of the sequence length will be 255, and the compression ceiling will be ½(255+1)=128. Runs in excess of the ceiling may be broken apart for compression in accordance with the invention. In step 206, a threshold for repetitions of the target pattern is selected. In many instances, selecting a threshold of one will provide maximum compression benefits, but in a few instances, applying the method with a threshold of one will expand the data rather than compacting it and in these instances a threshold of two or greater may advantageously be selected.

In step 208, a counter is reserved to track sequential repetitions of the target pattern in the data stream, and this run count is initialized at zero. Data characters from the data stream are read sequentially by the procedure, one sequence length at a time. In steps 210 and 212, the data processing means determines whether data is present at the next spot in the data stream and if data is not present, the data processor proceeds to step 232, which will be discussed later. If data is present, the processor gets these next characters at step 214, and at step 216, compares the next characters to the target pattern. If the next characters match the target pattern, the run count is incremented by one at step 218, and the processor then advances one sequence length in the data stream and repeats steps 210 and 212 with new data. If however, the next characters do not match the target pattern, then after step 216, the processor tests at step 220 whether the current run count is lower than the predetermined threshold. If it is, the next characters are simply written into the data storage device at step 222 and the processor returns to step 208.

Figure 4:
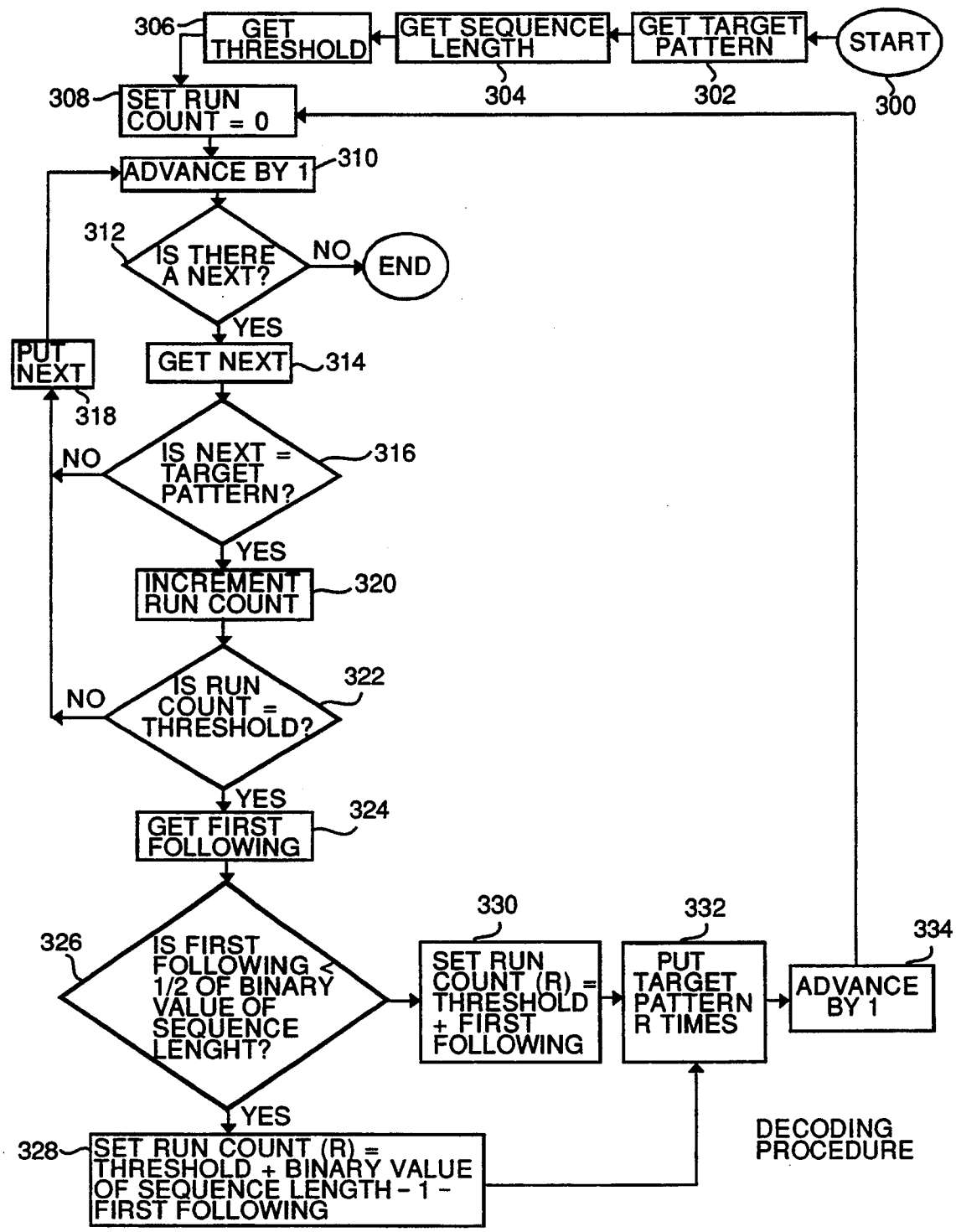
FIG. 4 is a flow chart of a decompression procedure in accordance with a preferred embodiment of the current invention.

If, however, the threshold has been equaled or exceeded, then the compression sequence is begun. At step 224, the value of the next character is compared to the value of the target pattern. All of the comparisons shown in FIG. 2, and later in FIG. 4 are done in accordance with whatever collating sequence it is desired that the values will be ordered by. Thus, the present invention may be used even if a specially programmed collating sequence is being used instead of the natural collating sequence, merely by doing all comparisons in accordance with the specially programmed sequence.

If the target pattern is the lesser of the two values, then, as shown at step 228, a compression count is calculated as a predetermined number less the difference between the current run count and the threshold. The predetermined number is preferably the bit value of the sequence length. Thus, for a one octet sequence length, the predetermined number would be 255. If the target pattern is the greater of the two values, then a compression count is calculated as the difference between the current run count and the threshold, as shown at step 230. In either case, the target pattern, the compression count computed at step 228 or 230, and the next characters, which will be seen to be the pattern following the final repetition of the target pattern in the run of repetitions, are written into the data storage device and the processor returns to step 208. If the repetitions of the target pattern continue to the end of the data stream, then when the processor tests for next characters at step 212, it will find none and proceed to step 232. At step 232, the current run count is compared to the threshold. If the run count is below the threshold, the procedure ends at step 238. If the run count equals or exceeds the threshold, at step 234 a compression count is calculated as the difference between the current run count and the threshold, and at step 236, the target pattern and the compression count are written into the data storage device, and only then does the procedure end at step 238.

FIG. 3 shows the compacted structure of the data string of FIG. 1 when compressed in accordance with the invention. It will be recalled that a run of R1 repetitions of CV2 occurred between CV1 and CV3, and a run of R2 repetitions of CV2 occurred after CV3. For the purposes of this example, CV2 is taken to be one octet in length. If CV2 was selected as the target pattern and T as the threshold for repetitions, then regardless of the lengths of the two runs of CV2, the compacted data stream becomes only 6 characters long, with the encoded characters CC1 and CC2 representing, respectively, the first and second runs of CV2. CC1 will equal R2-T if CV3<CV2 (in the selected collating sequence) or 255−(R2-T) if CV3>CV2. CC2 will equal R2-T.

Applying the present invention to the example data discussed above demonstrates the improvement over prior art compression methods in maintaining the collating sequence of the data provided by the present invention. It will be recalled that the example data (in which space characters were represented as x's for ease of visualization), was:

BENxxxxxxxTHOMASxxxx
BEN-SUNGxxMARYxxxxxx
BENTLEYxxxJOHNxxxxMD
BENTLEYxxxJOHNxxxPHD If this data were to be compressed in accordance with the invention, using the ASCII character set shown in FIG. 5, the space character as the target pattern, the natural collating sequence, and a threshold of 1, the compacted result would be:

BEN×<249>THOMAS×<3>
BEN-SUNG×<254>MARY×<5>
BENTLEY×<253>JOHN×<252>MD
BENTLEY×<253>JOHN×<253>PHD

This would collate naturally as:

BEN×<249>THOMAS×<3>
BEN-SUNG×<254>MARY×<5>
BENTLEY×<253>JOHN×<252>MD
BENTLEY×<253>JOHN×<253>PHD leaving the desired collating order unchanged.

Because the natural collating order of the data is preserved by the compression operation, sorting and multiple search operations can be performed on the data without decompression, providing a significant increase in efficiency. However, once data is sorted or selected, it will normally be required by the user in non-compressed form. FIG. 4 shows a procedure for restoring compacted data in accordance with a preferred embodiment of the invention.

Turning now to FIG. 4, the procedure is started in step 300, and in step 302 the sequence which was used as the target for compression when the data was compacted is input or recalled. As earlier noted, the target pattern may be either a single character, such as a spacer character, a multi-octet character, such as may be found in representations of Japanese or Chinese characters, or even a run of repeating multi-octet characters. In step 304, a sequence length equal to the length of the target pattern is selected, and in step 306, the compression threshold which was used in compacting the data is input or recalled.

In step 308, a counter is reserved to track sequential repetitions of the target pattern in the data stream, and this run count is initialized at zero. Data characters from the data stream are read sequentially by the procedure, one sequence length at a time. In steps 310 and 312, the data processing means advances by one sequence length and determines whether data is present at the next spot in the data stream. If data is not present, the data processor ends the procedure. If data is present, the processor gets these next characters at step 314, and at step 316, compares the next characters to the target pattern. If the next characters match the target pattern, the run count is incremented by one at step 320, and the processor tests at step 322 whether the current run count is lower than the predetermined threshold. If either the next characters do not match the target pattern at step 216, or the run count is lower than the threshold at step 322, the next characters are simply written into the data storage device at step 318 and the processor then advances one sequence length in the data stream and repeats steps 310 and 312 with new data. If, however, the target pattern is matched and the threshold is reached, the decompression sequence is begun at step 324.

At step 324, the processor advances one sequence length to read the pattern of characters first following the characters just tested. Because of the requirement that the threshold be reached before proceeding to this step, this pattern will be the first pattern after an identified occurrence of the target pattern which does not match the target pattern, and will always be the code for the compression count computed in the compression procedure. The purpose of the decompression procedure is to remove this first pattern from the data stream and replace it in the data stream with a fixed number of additional repetitions of the target pattern, the fixed number being chosen to be the sum of the first pattern and the threshold count if the pattern following the first pattern is less than the target pattern or if there is no following pattern, and to be a preselected number plus the threshold count less the first pattern if the following pattern is greater than the target pattern. If the preselected number is chosen, as is preferred, to be the maximum binary value of sequence length, then the first pattern will be less than the compression ceiling if the pattern following the first pattern is less than the target pattern or if there is no following pattern, and will be greater than the compression ceiling if the following pattern is greater than the target pattern. Testing the size of the first pattern is more efficient than testing the relationship between the target pattern and following pattern directly, so the invention is preferably implemented by testing the first pattern size, as shown in step 326.

If the target pattern is the lesser of the two values, then, as shown at step 328, a run count, R, is calculated as the predetermined number, most preferably the bit value of the sequence length, plus the difference between the threshold and the first following pattern. If the target pattern is the greater of the two values, then a run count, R, is calculated as the sum of the first following pattern and the threshold, as shown at step 330. In either case, at step 332, the target pattern is then written to the data storage device R times is written into the data storage device. It will be seen that the first following pattern is never written into the data storage device in this procedure. The processor next advances a sequence length in the data stream at step 334, and then returns to step 308. If the repetitions of the target pattern continued to the end of the data stream, then when the processor returns to test for the next data at step 312, it will find none and end the procedure.

Thus, there has been described herein a method of operating the data processing means for compactly storing data while maintaining its natural collating sequence, and for efficiently restoring retrieved data to an uncompacted form using a general compression technique. It will be understood that various changes in the details, arrangements, and steps which have been described and illustrated above in order to explain the nature of the present invention may be made by those skilled in the art without departing from the principle and scope of the present invention as expressed in the appended claims.

What is claimed is:

1. In a computer system comprising a data processing means, a memory means, and a data storage device containing data records,
    a method of operating the data processing means for compactly storing data while maintaining its natural collating sequence, comprising the steps of:
    selecting a target pattern for compression and a threshold count beyond which repetitions of the target pattern are to be compressed,
    reading a stream of data characters in sequence,
    comparing the characters with the target pattern and recording a run count of sequential repetitions of the target pattern, determining whether the run count exceeds the threshold count, and whenever it does, first determining whether the data pattern immediately following the run of target patterns in the data stream is greater than or less than the target pattern, and then replacing all repetitions of the target pattern in excess of the run count with a character string which includes a numerical code chosen to be the difference between the and the threshold count if the following pattern is less than the target pattern or if there is no following pattern, and to be a preselected number less the difference between the run count and the threshold count if the following pattern is greater than the target pattern.

2. A method according to claim 1 wherein the preselected number is the maximum binary value of the sequence length.

3. In a computer system comprising a data processing means, a memory means, and a data storage device containing a preselected target pattern, a preselected run count, and compacted data records in which all repetitions of the target pattern in excess of the run count have been replaced with a character string which includes a numerical code chosen to be the difference between the run count and the threshold count if the following pattern is less than the target pattern or if there is no following pattern, and to be a preselected number less the difference between the run count and the threshold count if the following pattern is greater than the target pattern, a method of operating the data processing means for restoring said data to its uncompacted form comprising the steps of:

reading a stream of data characters in sequence from said data records, comparing the characters with the target pattern and when a pattern match is identified, identifying the first pattern after the identified occurrence of the target pattern which does not match the target pattern, determining whether any pattern exists in the data stream immediately following said first pattern which is greater than the target pattern, and deleting said first pattern from the data stream and replacing said first pattern in the data stream with a fixed number of additional repetitions of the target pattern, said fixed number being chosen to be the sum of the first pattern and the threshold count if the following pattern is less than the target pattern or if there is no following pattern, and to be a preselected number plus the threshold count less the first pattern if the following pattern is greater than the target pattern.

4. A method according to claim 3 wherein the preselected number is the maximum binary value of the sequence length.

5. A method according to claim 4 wherein the step of determining whether the following pattern is greater than the target pattern comprises the steps of determining the value of the compression ceiling from the value of the sequence length, comparing the first pattern to the compression ceiling, and determining that the following pattern is greater than the target pattern if the following pattern is less than the compression ceiling.

* * * * *